(12) United States Patent
Palmer et al.

(10) Patent No.: US 7,050,939 B2
(45) Date of Patent: May 23, 2006

(54) METHOD AND APPARATUS FOR EVALUATING AUTOMOTIVE WINDOW REGULATORS

(75) Inventors: Thomas N. Palmer, Jonesville, MI (US); Karyn D. Jordan, Mosherville, MI (US); Tamio Hirose, Battle Creek, MI (US)

(73) Assignee: Hi-Lex Controls, Inc., Litchfield, MI (US)

( * ) Notice: Subject to any disclaimer, the term of this patent is extended or adjusted under 35 U.S.C. 154(b) by 0 days.

(21) Appl. No.: 11/003,272

(22) Filed: Dec. 3, 2004

(65) Prior Publication Data

US 2005/0192776 A1 Sep. 1, 2005

Related U.S. Application Data

(62) Division of application No. 09/978,523, filed on Oct. 16, 2001, now Pat. No. 6,842,717.

(51) Int. Cl.
*G06F 11/30* (2006.01)

(52) U.S. Cl. ...................................... 702/182; 318/128

(58) Field of Classification Search ............ 702/57–59, 702/64, 66, 69, 115, 124, 126, 189, 182–185, 702/191, 193, 195; 318/128, 460, 490, 565; 324/512–513, 520, 529, 772
See application file for complete search history.

(56) References Cited

U.S. PATENT DOCUMENTS

| | | | | |
|---|---|---|---|---|
| 1,320,918 A | | 11/1919 | Reyer .............................. 281/5 |
| 4,596,154 A | * | 6/1986 | Greubel .................... 73/862.08 |
| 4,614,117 A | | 9/1986 | Taniguti ....................... 73/659 |
| 4,646,453 A | | 3/1987 | Reinhart ...................... 40/117 |
| 4,715,706 A | * | 12/1987 | Wang .......................... 356/5.1 |
| 4,745,564 A | | 5/1988 | Tennes et al. .............. 364/566 |
| 4,758,964 A | | 7/1988 | Bittner et al. ............... 364/508 |
| 4,910,088 A | * | 3/1990 | Baudin et al. .............. 428/432 |
| 4,980,844 A | | 12/1990 | Demjanenko et al. ...... 364/550 |
| 5,126,641 A | | 6/1992 | Putman et al. .............. 318/128 |
| 5,226,259 A | * | 7/1993 | Yamagata et al. ............ 49/502 |
| 5,419,197 A | | 5/1995 | Ogi et al. ..................... 73/659 |
| 5,852,793 A | | 12/1998 | Board et al. .................. 702/56 |
| 6,014,598 A | | 1/2000 | Duyar et al. .................. 701/29 |
| 6,081,654 A | * | 6/2000 | Morman et al. ............... 703/1 |
| 6,141,910 A | * | 11/2000 | Kobrehel et al. ............. 49/378 |
| 6,199,018 B1 | | 3/2001 | Quist et al. .................. 702/34 |
| 6,259,224 B1 | | 7/2001 | Smith et al. ................ 318/629 |
| 6,262,550 B1 | | 7/2001 | Kliman et al. .............. 318/565 |
| 6,321,602 B1 | | 11/2001 | Ben-Romdhane ............ 73/660 |
| 6,392,584 B1 | * | 5/2002 | Eklund ........................ 341/183 |
| 6,415,238 B1 | | 7/2002 | Ottesen et al. ............. 702/109 |
| 6,639,411 B1 | * | 10/2003 | Thomsen .................... 324/537 |
| 6,684,541 B1 | | 2/2004 | McPhaul ..................... 40/517 |

* cited by examiner

*Primary Examiner*—Marc S. Hoff
*Assistant Examiner*—Mary Catherine Baran
(74) *Attorney, Agent, or Firm*—Young & Basile, P.C.

(57) ABSTRACT

A method and apparatus for evaluating window regulators of the type having a reversible electric motor connected to a slide/carrier plate by means of cables. The apparatus comprises a first transducer such as a piezoelectric accelerometer or a laser for generating a first signal quantity related to periodic noise produced by the motor during operation thereof, a second transducer such as a piezoelectric accelerometer for producing a second signal quantity representing transient noise produced by irregularities in the slide/carrier plate assembly during travel of the carrier plate along the slide, and a processor for decoding the first and second waveforms and using data derived therefrom as a basis for identifying unacceptably noisy window regulator assemblies. The method comprises placing the window regulators on a test fixture, operating the window regulator with a simulated glass load, and generating and processing the first and second signal quantities as described above.

15 Claims, 6 Drawing Sheets

METHOD AND APPARATUS FOR EVALUATING AUTOMOTIVE WINDOW REGULATORS

CROSS-REFERENCE TO RELATED APPLICATION

This application is a divisional of U.S. Ser. No. 09/978,523, filed Oct. 16, 2001, now U.S. Pat. No. 6,842,717 and claims priority thereto.

FIELD OF THE INVENTION

This invention relates to automotive window regulators and more particularly to a method and apparatus for evaluating automotive window regulators during pre-installation operation thereof to identify window regulators which are unacceptably noisy.

BACKGROUND OF THE INVENTION

An automotive window regulator generally comprises the combination of a relatively small electric motor which is connected through a reduction drive, a drum and two or more cables to at least one slide/carrier plate assembly to which the window glass is attached when assembled into an automobile door or hatch. When the motor is operated it winds and unwinds the cables so as to cause the carrier plate or plates to travel along the slide or slides. When a window is attached to the carrier plate or plates, it moves in the open or close directions according to the direction of motor travel.

Manufacturing defects occasionally make such window regulators unacceptably noisy such that operation thereof in an automobile is displeasing to the owner. Noise can be the result of a number of different factors including motor armature imbalance, defective motor bearings, irregular motor commutator surfaces causing brush bounce or rattle, and surface imperfections such as dents and burrs in the finish of the metal slide where it is contacted by the carrier plate.

Noise produced by an installed window regulator tends to be amplified by the automobile door panels and, therefore, a regulator which may not sound particularly noisy before installation may be unacceptably noisy after installation. There is a significant advantage in identifying unacceptably noisy window regulators prior to installation into the automobile since replacement of the regulator after installation is more costly than discarding a faulty regulator prior to assembly into an automobile.

To our knowledge, window regulators have not been routinely tested for noise on the factory floor during the assembly process. We believe that this is due to the fact that ambient noise levels are too high in most factories to use microphonic pickups for noise detection. While this problem could be solved by removing the regulator to a noise-insulated test chamber, it is impractical to do this with every regulator made in a mass-production facility.

SUMMARY OF THE INVENTION

According to one aspect of the present invention, window regulator motors can be efficiently evaluated for noise/vibration characteristics on the factory floor by placing the motor on a support such as a test fixture or assembly-line pallet, operating the motor and arranging a suitable transducer in exclusive energy transfer relationship with the motor housing so as to generate a waveform representing periodic noise/vibration components emanating only from the motor. This waveform may be processed on-line to identify all window regulator motors which are unacceptably noisy.

As hereinafter set forth, transducers which can be disposed in exclusive energy transfer relationship with a chosen target such as a motor housing include single-axis accelerometers and lasers.

According to a second aspect of the invention a window regulator slide/carrier plate assembly is efficiently evaluated for operating noise characteristics by placing the assembly on a support such as a test fixture or assembly-line pallet, operating the carrier plate with a simulated glass load to cause it to travel along the slide, and, arranging a suitable transducer such as single axis accelerometer in exclusive energy transfer relationship with the carrier plate so as to generate a waveform representing transient noise components occuring during operation of the assembly. This waveform can be processed to identify unacceptably noisy assemblies prior to installation.

According to a third aspect of the invention the foregoing first and second aspects are used in combination by placing window regulator assemblies of a type comprising a motor, a slide/carrier plate combination and a cable drive on a support such as a test fixture or assembly-line pallet, operatively associating first and second noise/vibration transducers with the motor housing and the carrier plate respectively, operating the window regulator assembly and generating first and second waveforms representing the periodic and transient noise characteristics produced by operation of the assembly. These two waveforms are processed to identify unacceptably noisy window regulator assemblies according to any of a number of different criteria.

In the preferred form, the apparatus for carrying out the invention comprises an assembly-line conveyor pallet forming a support surface for a test fixture on which window regulator assemblies are placed during and/or as part of an overall assembly operation on the factory floor; i.e., because the pickups are essentially exclusive, no sound chamber is required for isolation. The conveyor is such as to cause the pallet and window regulator assembly disposed thereon to pass through a test station where a first transducer, such as a single axis accelerometer, is magnetically attached to the motor housing. In addition, a second accelerometer supported on a bracket which is detachable relative to a hanger assembly is positioned where it will be picked up by the carrier plate and carried along with the carrier plate during operation of the window regulator assembly. A weight is attached by cable or the like to the bracket on which the second accelerometer is mounted to simulate a glass load when the carrier plate fits into and moves with the accelerometer support bracket during operation of the window regulator assembly. Two waveforms are generated by the transducers representing periodic and aperiodic or transient noise components. These waveforms are processed to identify unacceptably noisy window regulator assemblies before they are assembled into automobile doors.

In the preferred form the data from the processor is transferred to a memory module on the pallet so that it stays with the individual window regulator for use in sorting regulators at a terminal point on the assembly line.

As further disclosed herein a laser may be substituted for the motor accelerometer to permit, for example, evaluation of motors having non-ferromagnetic housings. Doppler-shift principles are used to create frequency components representing the noise/vibration of the motor housing during operation thereof.

As used herein the terms "noise" and "vibration" are interchangeable and synonymous; i.e. they are used together and separately to refer to periodic and transient accelerations of the structure under test.

BRIEF DESCRIPTION OF THE DRAWINGS

The description herein makes reference to the accompanying drawings wherein like reference numerals refer to like parts throughout the several views, and wherein.

DESCRIPTION OF THE PREFERRED EMBODIMENTS

Figure 1:
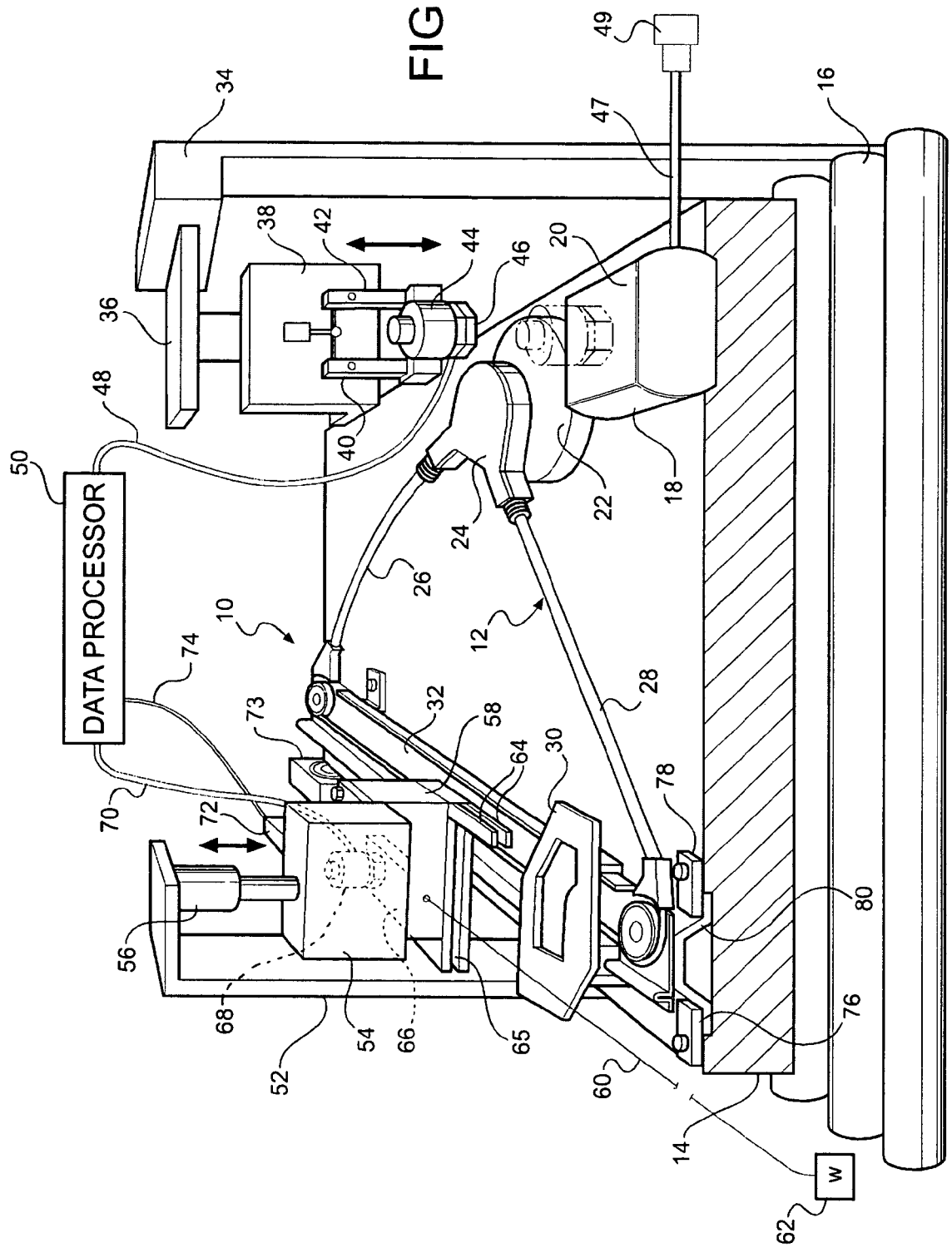
FIG. 1 is a perspective view of a window regulator assembly on a conveyor pallet in a test location for testing both the window regulator motor and the carrier/slide for noise.
Figure 6:
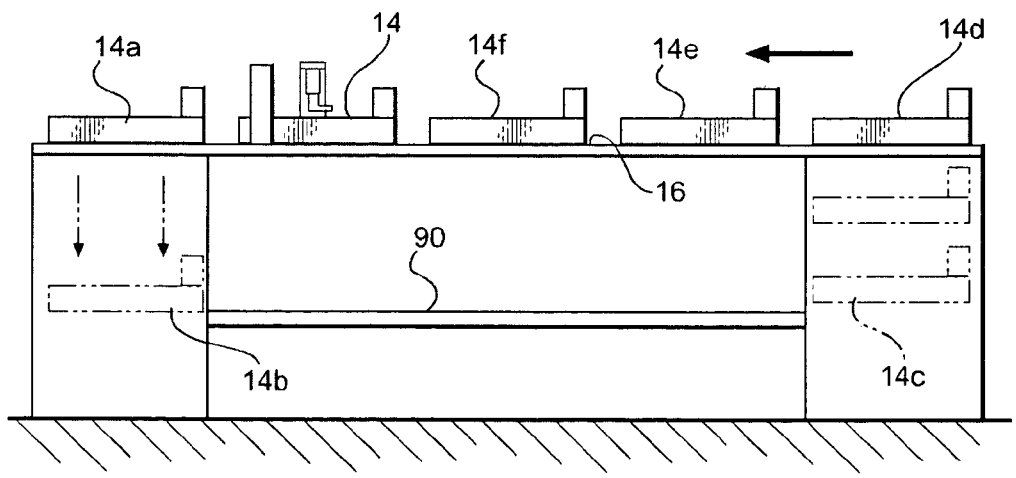
FIG. 6 is a diagramatic side view of a conveyor for handling the pallets of FIG. 1 and causing a series of pallets to move through a series of assembly stations as well as the test station.

FIG. 1 shows an apparatus 10 for evaluating window regulators 12 for noise and vibration characteristics as they are assembled on the factory floor. The apparatus 10 comprises a pallet 14 which in this case defines a test fixture mounted for intermittent movement along a conveyor 16 between multiple assembly stations and the test station represented in FIG. 1. Further details of the conveyor are shown in FIG. 6.

The window regulator 12 is representative and comprises a DC electric motor 18 having a ferromagnetic housing 20 connected to a reduction drive unit 22 and a drum housing 24. Cables 26 and 28 connect the drum in housing 24 to an assembly comprising a carrier plate 30 adapted to receive automotive window glass (not shown) and to travel along a bowed metal slide 32 having attached feet 80. Other types of regulators can also be tested using the principles discussed herein in example, regulators used for large heavy glass panels often have two carrier plate and slide assemblies.

At the right side of the apparatus shown in FIG. 1 a first transducer support assembly 34 is secured to the conveyor bed so it is in a fixed location relative to pallet 14 when it arrives in the test station. Assembly 34 comprises a bracket 36 connected to a vertically moveable elevator plate 38 carrying clamp fingers 40 and 42 which releasably clamp to and hold a first transducer in the form of a single axis piezoelectric pick up 44 having a permanent magnet base 46. In the arrangement shown in FIG. 1, the pallet 14 with the window regulator assembly 12 mounted thereon for assembly and test purposes arrives at and is temporarily locked into the test station by conventional means (not shown). In this position the motor housing 20 is directly under the piezoelectric pick up 44 such that operation of the elevator 38 in the downward direction shown by the double ended arrow brings the transducer 46 into contact with the flat top of the motor housing 20. When this is achieved the clamp fingers 40 and 42 are released to place the pickup 44 in exclusive energy transfer relationship with the motor housing.

The motor 18 has a power head 47 which is connectable to a dc power plug 49 such that the motor can be run in both directions while in the test location. Vibration caused by any of the factors described above will cause periodic displacement of the motor housing 20 along the sensitive axis of the piezoelectric transducer 44; i.e., the vertical axis as shown in FIGS. 1–4, to produce a periodic output waveform from the transducer 44. This waveform is connected by way of signal line 48 to a fixed conveyor-side data processor 50. When the fingers 40 and 42 are actuated to release their grip on the transducer 44, the transducer is in exclusive energy transfer relationship with the motor housing 20 so as to pick up and respond to vibration thereof exclusive of all other noise which might be generated in the factory area around the test location. It will be appreciated by those skilled in the art that the motor armature (not shown) within the housing 20 is mounted for rotation about an axis which is orthogonal to the sensitive axis of the transducer 44 such that rotation of the motor armature unless perfectly balanced in good bearings causes a periodic reciprocal movement of the motor housing along the sensitive axis of the piezoelectric transducer 44. The fundamental frequency of the vibration is related to the rotation speed of the motor 18 but, as will be understood by those skilled in motor technology, there will be other frequencies, usually multiples of the motor rotation frequency, to which the accelerometer 44 will respond and which will result in other waveform components to be analyzed. These frequencies, as mentioned above, may occur at multiples of the fundamental frequency wherein the multiplying factor is the number of commutator segments in a particular motor design. Moreover, there will be sum and difference components in the waveform where multiple frequency components, including harmonics, are present.

The motor housing 20 shown in FIG. 1 has flat top and bottom surfaces and curved side surfaces. Therefore the contact surface of the magnet 46 is also preferably flat. In the event it is desirable to maintain contact between the transducer 44 and a non-flat motor housing, the magnet may be machined to the contour of the motor housing to maintain good magnetic association.

Continuing with the description of the apparatus 10 shown in FIG. 1, a second support assembly 52 is mounted in a fixed location on the conveyor bed on the left side of the pallet 14 as shown in FIG. 1. Assembly 52 comprises a hanger 54 which is connected to the bracket 52 by means of a pneumatic elevator 56 such that the bracket may be raised and lowered relative to the path of the carrier plate 30 as it slides along the slide mechanism 32. Hanger 54 releasably receives a bracket 58 having fingers 64 and a horizontal slot 65 to receive the carrier plate 30 edgewise therein when the carrier plate moves toward the bracket 58 and the bracket is at the correct elevation as determined by the elevator 56. Bracket 58 has a pedestal portion 66 on which a second single axis piezoelectric transducer 68 is removably magnetically attached. Transducer 68 is responsive to vibration displacement along its sensitive axis to produce an electrical signal waveform which is connected by signal line 70 to the data processor 50.

The test location represented by the pallet 14 in FIG. 1 is further provided with releasable clamps 76 and 78 to hold the slide 32 in place during assembly and test thereof. As will be apparent to those skilled in the conveyor and transfer machinery arts, clamps are preferably provided for several parts of the window regulator 12 during test and those clamps are preferably automatically operated by pneumatic actuators.

Figure 5:
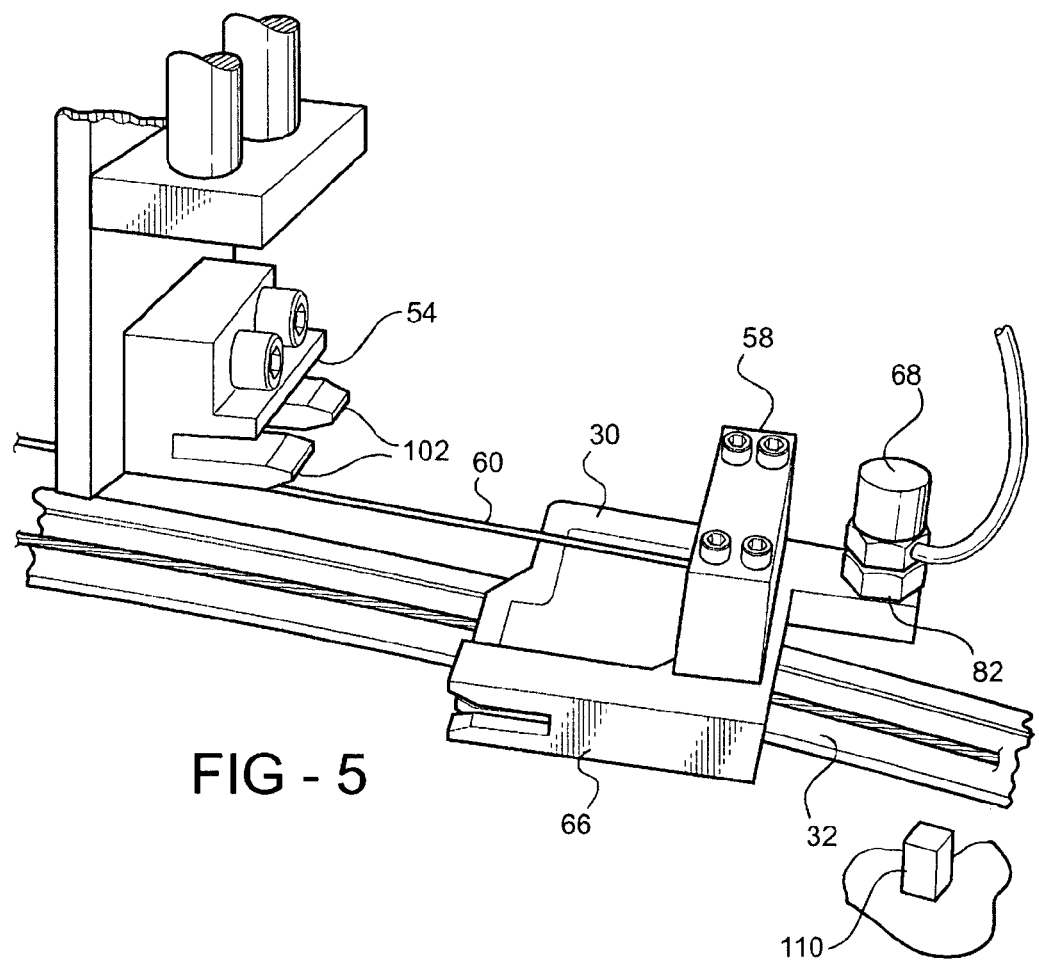
FIG. 5 is a perspective view of the carrier plate transducer hanger and bracket.

A weight 62 simulating a glass load is connected to the bracket 58 by means of a cable 60 which may pass through several pulleys before being attached to a free weight 62. The path to the cable 60 is kept clear so that it imposes an inertial force on the bracket 58 intending to hold the bracket 58 on the hanger 54 as shown in FIGS. 1 and 5 and thereafter to simulate the weight of a window panel attached to the carrier plate 30.

The data processor 50 processes the signal waveforms received by and on signal lines 48 and 70 and produces a complex output signal on line 74 which is connected to a transmitter 72 adjacent the conveyor path. The transmitter 72 communicates the intelligence or data content of the signal to a memory unit 73 which is associated with each pallet 14 in a series of pallets moving along conveyor 16. The transmitter 72 and memory unit 73 are conventional devices and may operate with inductive or infrared or RF links.

As will be appreciated by those skilled in the waveform analysis and mathematics arts, the signals transmitted by lines 48 and 70 to the data processor 50 may take many forms depending on the type of noise and/or vibration signal under analysis. As earlier indicated, waveform coming to the data processor on line 48 is periodic in nature and is analyzed using classic frequency domain analysis principles. The analysis is preferably not model based; i.e., it is not based on vibration or noise signatures taken from a series of devices with known or prearranged defects. Rather, the analysis looks at specific frequency components and issues a pass/fail output according to the magnitudes of these components relative to an objective standard. The signal arriving at the data processor 50 on line 70 is transient or aperiodic in nature since it is derived from clicks, bumps and the like caused by surface irregularities in the slide structure 32 where it is contacted by the carrier plate 30. Accordingly a simple time domain analysis may be employed for this portion of the signal.

The signal which is communicated to the units 72 and 73 is preferably of a complex character; i.e., having data components representing both the inputs on lines 48 and 70. The ultimate termination is one of pass-fail but the signal communicated to the memory unit 73 has enough intelligence in it to determine whether the failure is based on the motor 18 or the carrier plate/slide assembly 30, 32 or both.

Figure 2:
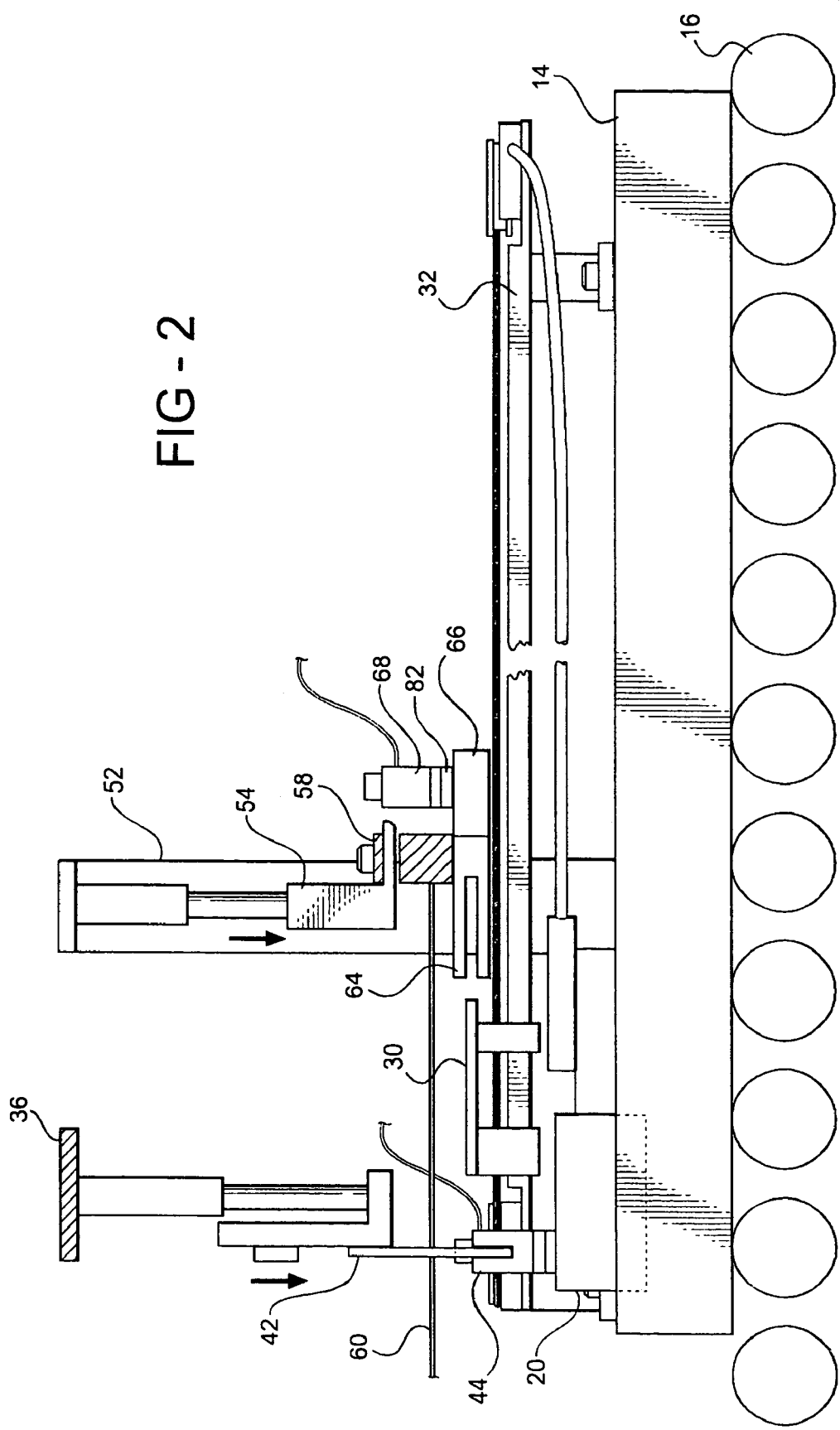
FIG. 2 is a side view of the apparatus of FIG. 1 with the carrier plate of the window regulator assembly moving toward engagement with the transducer bracket.

FIG. 2 is a side view of the FIG. 1 apparatus showing the condition of the apparatus 10 when the transducer 44 is lowered into place on the motor housing 20 and the hanger 54 is lowered to the point that the bracket 58 has the slotted portion 64 on the same level as the slide plate 30 such that movement of the slide plate 30 from left-to-right as shown in FIG. 2 will cause the plate to engage the receiver slot in the bracket 58, 66.

Figure 3:
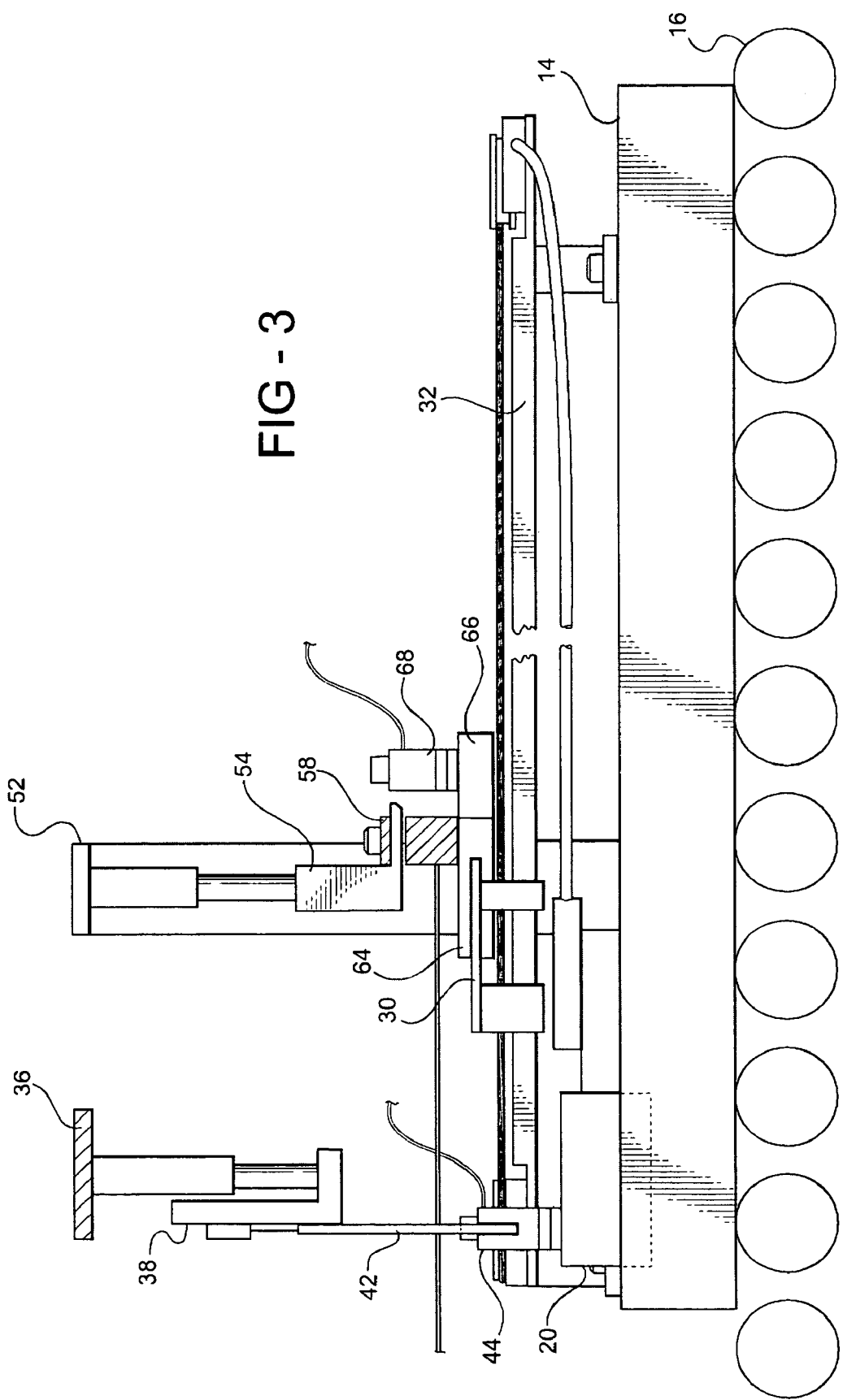
FIG. 3 is a side view of the apparatus of FIG. 1 with the carrier plate in engagement with the transducer bracket.
Figure 4:
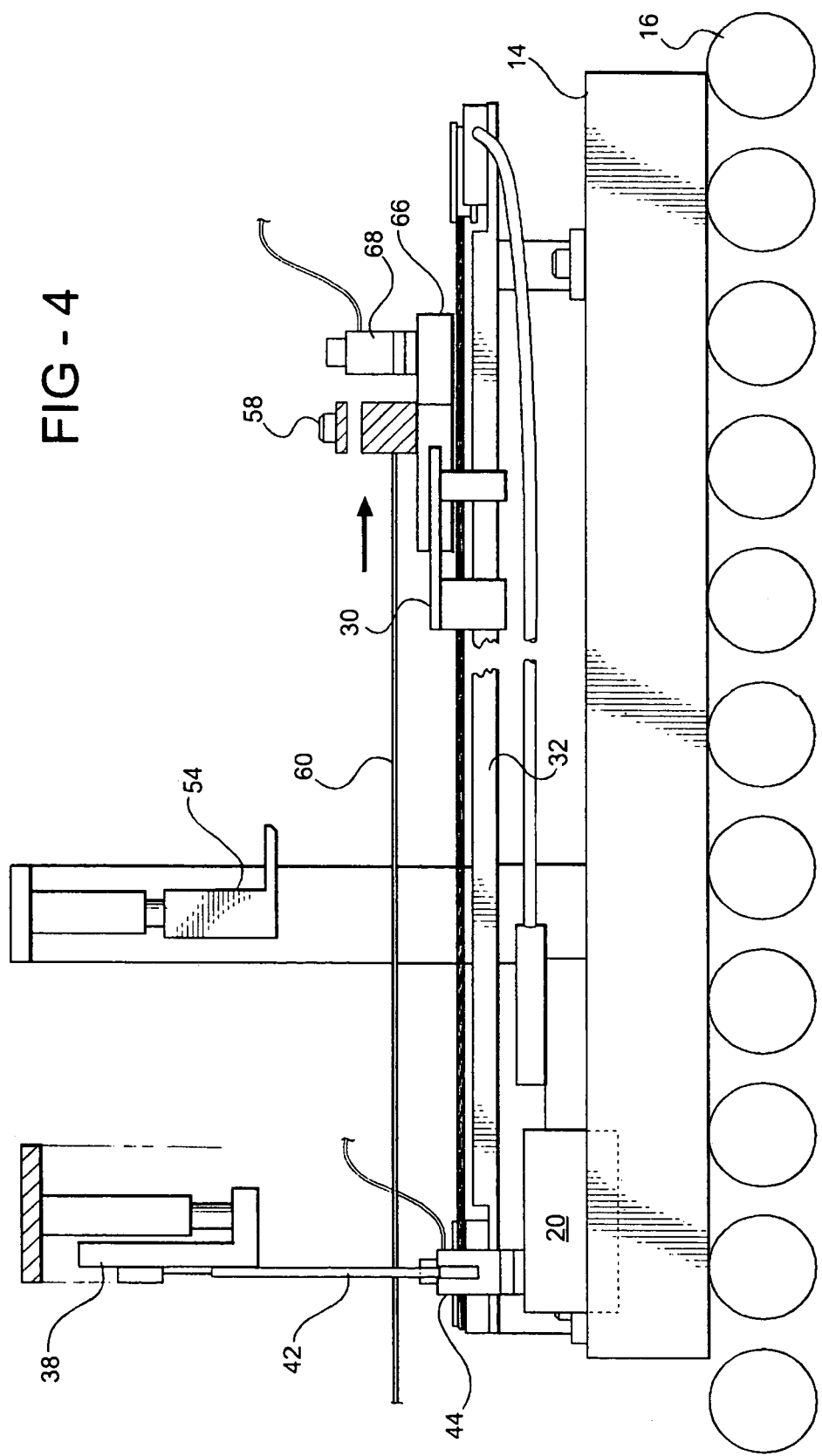
FIG. 4 is a side view of the apparatus of FIG. 1 with the carrier plate in engagement with the transducer bracket and with the bracket detached from the hanger.

FIG. 3 shows how the carrier plate 30, when the motor 18 is running in the left-to-right direction as shown in FIG. 3, advances into physical engagement with the bracket 66. As shown in FIG. 4, further advance of the carrier plate 30 causes the bracket 58, 66 to separate from the hanger 54 such that the piezoelectric transducer 68 is in exclusive energy transfer relationship with the carrier plate/slide assembly 30, 32. Note that the drag line 60 is connected to the bracket 58 to resist the movement from left-to-right as shown in FIG. 4 and to assist in rehanging bracket 58, 66 on the hanger 64 when the motor 18 is reversed to cause the carrier plate 30 to travel from right-to-left as shown in FIG. 4. Since noise transients can be directionally sensitive, the transducer 68 is operated to produce an output during both directions of travel along the slide 32.

FIG 5 shows the bracket 58, 66 in greater detail when in full engagement with the carrier plate 30. The basket handle shaped portion of the bracket 58, 66 slides into the slot created by the fingers 102 of the hanger 54 and the weight attached to the cable 60 holds the bracket 58, 66 on the hanger after it reaches the hanger during the return stroke. The hanger 54 is thereafter lifted by the elevator mechanism 38 previously described. The magnet 82 is faceted such that it may be turned onto a stud (not shown) extending vertically from the base of pickup 68.

The sequence of events is essentially as follows:

1. The pallet 14 is advanced until it is in the test station shown in FIG 1; i.e., between the supports 34 and 52 on which the transducers 44 and 68 are mounted;

2. The motor 18 is connected to the power source plug 49;

3. The bracket 38 is lowered until the magnet 46 is in contact with the motor housing 20;

4. The clamp fingers 40 and 42 are released;

5. The elevator 56 lowers the hanger 54 until the slotted portion 64, 65 is on the same elevation as the carrier plate 30; note this may require the momentary operation of the motor 18 to move the carrier plate 30 to a clear position as shown in FIG 1;

6. The motor is operated to move the carrier plate from left-to-right as shown in FIGS. 2, 3 and 4. This produces an output waveform from transducer 44 which is communicated to the data processor 50 as previously described. In addition operation of the motor in the direction described above causes the carrier plate 30 to engage with bracket 58, 66 to disengage the bracket from the hanger 54 and move the bracket against the retarding force of the drag line 60 and the free weight 62.

7. When the carrier plate reaches the right-hand limit of travel a proximity switch or limit switch (110) sends a signal to the data processor 50 which reverses the motor input signal polarity and causes the motor to reverse direction. This causes the carrier plate 30 to progress in the opposite direction. The bracket 58 is reinstalled on hanger 54.

8. The transducer 68 is active to produce an output signal waveform on cable 70 to the data processor 50 during both directions of travel;

9. When a full-cycle of travel has been achieved the clamp fingers 40 and 42 are re-engaged to grasp the transducer 44. Both elevator units are activated to lift the transducers and/or carrier assemblies thereof upwardly;

10. The result of the analysis is communicated by data processor to memory unit 73 by way of transmitter 72;

11. The elevator assemblies 38 and 54 raise the transducers 44 and 48 relative to the regulator 12 to provide clearance for forward movement thereof; and 12. the pallet 14 is advanced to the next station.

FIG. 6 shows one possible conveyor setup for integrating window regulator assembly and test operations. The test location is shown by reference numeral 14 on the top surface of the conveyor table 16 with pallets moving from right-to-left as shown in the drawing. After exiting the test station represented by reference numeral 14, the pallets move to a position 14a. In this position they are dropped downwardly by an elevator assembly to position 14b whereupon they are conveyed from left-to-right along a roller assembly 90 to position 14c. At this point a second elevator lifts each pallet to position 14d whereupon it is moved intermittently through assembly stations 14e and 14f. It will be understood that the arrangement shown in FIG. 6 is exemplary and diagrammatically portrayed.

Figure 7:
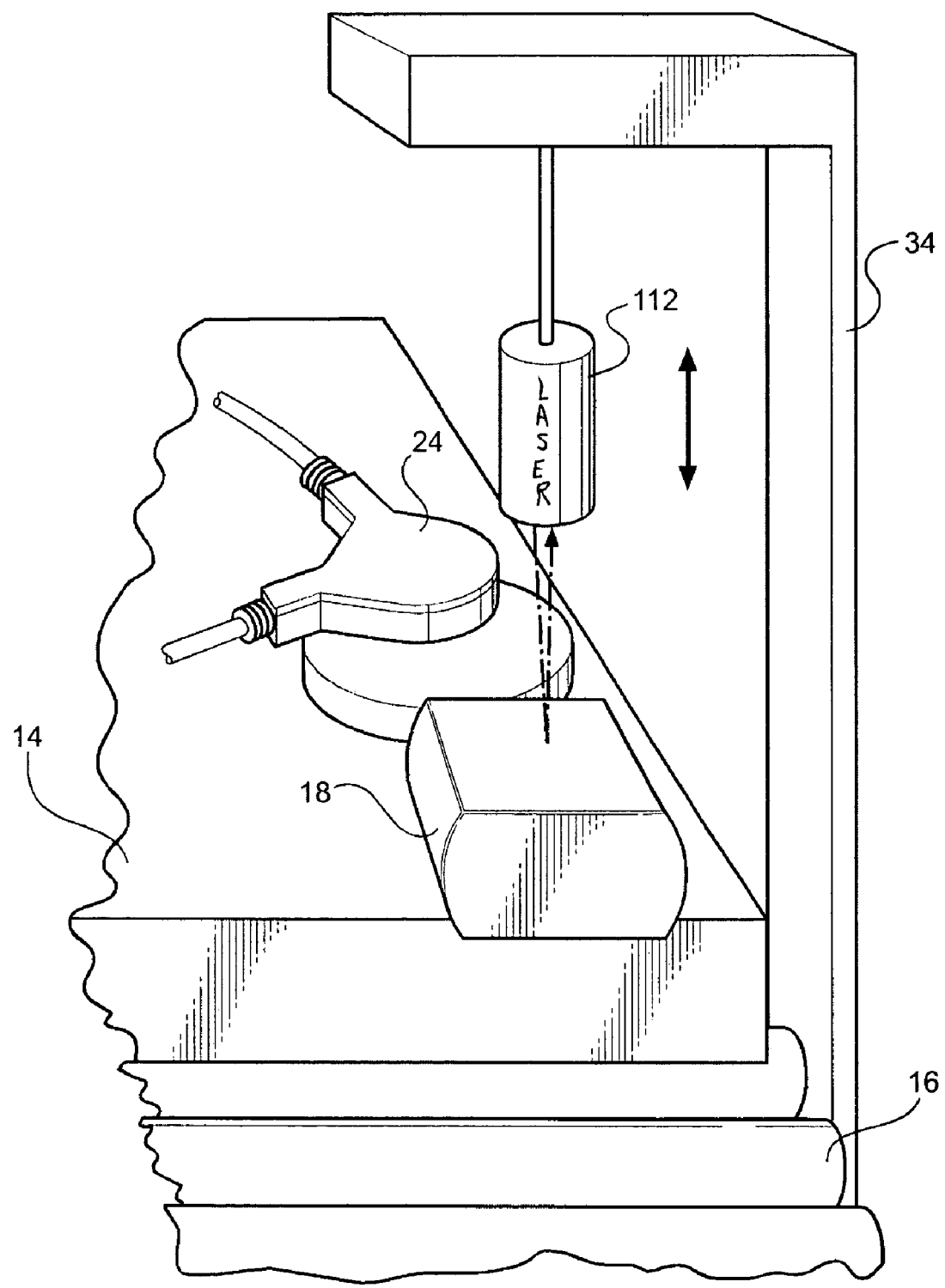
FIG. 7 is a diagrammatic representation fo a laser transducer for use as a motor vibration pickup.

Should the motor 18 not have a ferromagnetic housing, it is then not possible to achieve an exclusive energy transfer relationship between the housing and the transducer 44 by means of the permanent magnet 82 shown in FIG. 5. As shown in FIG. 7 this situation can be accommodated using a laser transceiver 112 in place of the single axis piezoelectric transducer 44. The laser transceiver 112 is disposed on the bracket 34 but requires no elevator mechanism to raise and lower it out of contact with the motor 18. Instead the laser transceiver 112 maintains a fixed spacing from the motor housing and, when activated, directs a fixed frequency light signal toward the motor housing. Reflections of this signal are picked up by the transceiver and are Doppler shifted according to the frequency of the vibratory movements or displacement of the motor housing along the line of sight axis of the laser transceiver 112. These Doppler shifts in the basic laser frequency produce sum and difference signals according to the components of the vibration and resulting signals are analyzed by processor 50 in the manner described above.

It will be appreciated that the motor noise analysis process and the carrier plate/slide transient noise analysis process may be carried out individually; i.e., each without use of the other. Alternatively, as shown herein, they may be carried out in combination. For example, it may be desirable to test motors at the place of manufacture thereof before assembly into window regulators. Similarly carrier plate/slide assemblies may be temporarily connected to a motor power source for operation independently of the final dedicated motor to which they are to be attached.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. Apparatus for evaluating window regulator assemblies of the type comprising a slide and carrier plate according to noise generated during operation thereof comprising:
   a support for receiving window regulator assemblies in a test location;
   a drive for causing the carrier plate to travel along the slide of said assembly;
   a transducer positioned at the test location;
   a positioning device operative to dispose the transducer in exclusive energy transfer relationship with the slide and carrier plate as the carrier plate travels along the slide and responsive to noise produced during travel of the carrier plate along the slide to produce a signal quantity related to such noise; and
   a processor for receiving and analyzing said signal quantity for a basis for identifying unacceptably noisy window regulator assemblies.

2. Apparatus as defined in claim 1 wherein the transducer is a piezoelectric pickup.

3. Apparatus as defined in claim 2 further including apparatus for attaching the pickup to the carrier plate for travel therewith during operation of the window regulator assembly.

4. Apparatus as defined in claim 3 wherein the attaching apparatus comprises a hanger and a detachable bracket, the pickup being carried by the detachable bracket.

5. Apparatus as defined in claim 4 further including a dragline attached to the detachable bracket for imposing a weight load thereto simulating a window.

6. Apparatus as defined in claim 1 wherein the drive comprises a reversible electric window regulator motor attached to the carrier plate by cables.

7. Apparatus as defined in claim 1 wherein the support comprises a pallet and a conveyor for moving the pallet into and out of a test station.

8. Apparatus as defined in claim 7 further including a memory unit attached to the pallet for receiving pass/fail data regarding window regulator assemblies carried by said pallet and subjected to test in said test location and a transmitter connected to said processor for transmitting pass/fail information to the memory unit.

9. Apparatus for evaluating window regulator assemblies of the type having an electric drive motor and a slide/carrier plate assembly connected to the motor by cables such that operation of the motor causes the carrier plate to travel along the slide comprising:
   a support for receiving window regulator assemblies in a test location;
   an electrical connector proximate said location for placing electric motors positioned in said location in an operating condition;
   a first transducer adapted to be disposed in energy transfer relationship with the motor of a window regulator assembly positioned in the test location and responsive to the noise characteristics produced during operation thereof to produce a signal quantity having a primary periodic component based on motor rotation speed and other periodic components resulting from motor characteristics producing noise;
   a second transducer positioned in the test location;
   a positioning device operative to dispose the second transducer in exclusive energy transfer relationship with the slide/carrier plate assembly of the window regulator assembly positioned in the test location and responsive to noise produced thereby during travel to produce a second signal quantity; and
   a processor for receiving and analyzing the first and second signal quantities as a basis for identifying unacceptably noisy window regulator assemblies.

10. Apparatus as defined in claim 9 wherein the first and second transducers are piezoelectric pickups.

11. Apparatus as defined in claim 9 wherein the first transducer is a laser transceiver.

12. Apparatus as defined in claim 9 further comprising a magnet connected to the first transducer for attaching said transducer to a ferromagnetic motor housing.

13. A method of evaluating window regulators of the type having a reversible electric motor connected to a slide/carrier plate according to noise characteristics generated by the window regulator during operation thereof comprising the steps of:
   supporting the window regulator on a base;
   operating the window regulator with a simulated glass load to cause the carrier plate to travel along the slide;
   positioning a transducer in exclusive energy transfer relationship with the slide/carrier plate as the carrier plate travels along the slide and developing at least one signal quantity related to noise produced by the travel of the carrier plate along the slide; and processing the signal quantity to identify unacceptably noisy window regulators.

14. Apparatus for evaluating window regulator assemblies of the type having an electric drive motor and a slide/carrier plate assembly connected to the motor by cables such that operation of the motor causes the carrier plate to travel along the slide comprising:
- a support for receiving a window regulator in the test location;
- an electrical connector proximate said location for placing electric motors in said location in an operating condition;
- a first transducer adapted to be disposed in energy transfer relationship with a motor in the test location and responsive to the noise characteristics produced during operation thereof to produce a signal quantity having a primary periodic component based on motor rotation speed and other periodic components resulting from motor characteristics producing noise;
- a second transducer adapted to be disposed in energy transfer relationship with the slide/carrier plate assembly of the window regulator and responsive to noise produced thereby during travel to produce a second signal quantity; and
- a processor for receiving and analyzing the first and second signal quantities as a basis for identifying unacceptably noisy window regulator assemblies;
- the apparatus further comprising a hanger and a detachable support bracket detachably supported by said hanger;
- the second transducer comprising a magnet for detachably attaching the second transducer to the detachable bracket.

15. A method of evaluating window regulators of the type having a reversible electric motor connected to a slide/carrier plate according to noise characteristics generated by the window regulator during operation thereof comprising the steps of:
- supporting the window regulator on a base;
- operating the window regulator with a simulated glass load;
- developing at least one signal quantity related to noise produced by the window regulator during operation thereof; and
- processing the signal quantity to identify unacceptably noisy window regulators;
- the step of developing at least one signal quantity comprising the sub-steps of attaching a first accelerometer to the window regulator motor and attaching a second accelerometer to the carrier plate.

* * * * *